United States Patent
Yin et al.

(10) Patent No.: US 7,082,149 B1
(45) Date of Patent: Jul. 25, 2006

(54) HIGH POWER DIODE SIDE PUMPED SOLID STATE LASER

(75) Inventors: Yusong Yin, Stonybrook, NY (US); Shane Shizhou Zhang, Stonybrook, NY (US)

(73) Assignee: Photonics Industries Int'l, Bohemia, NY (US)

( * ) Notice: Subject to any disclaimer, the term of this patent is extended or adjusted under 35 U.S.C. 154(b) by 251 days.

(21) Appl. No.: 10/603,264

(22) Filed: Jun. 24, 2003

(51) Int. Cl.
  *H01S 3/91* (2006.01)
  *H01S 3/94* (2006.01)

(52) U.S. Cl. ......................................... 372/75; 372/99

(58) Field of Classification Search .................. 372/75, 372/99, 77
See application file for complete search history.

(56) References Cited

U.S. PATENT DOCUMENTS

| | | | | |
|---|---|---|---|---|
| 4,764,933 A | * | 8/1988 | Kozlovsky et al. | 372/40 |
| 4,785,459 A | * | 11/1988 | Baer | 372/75 |
| 4,808,789 A | * | 2/1989 | Muncheryan | 219/121.6 |
| 4,837,771 A | * | 6/1989 | Baer | 372/75 |
| 4,894,839 A | * | 1/1990 | Baer | 372/93 |
| 4,908,832 A | * | 3/1990 | Baer | 322/94 |
| 4,916,712 A | * | 4/1990 | Bender | 372/75 |
| 5,091,915 A | * | 2/1992 | Tatsumi et al. | 372/75 |
| 5,181,223 A | * | 1/1993 | Baer et al. | 372/69 |
| 5,271,031 A | * | 12/1993 | Baer | 372/93 |
| 5,463,649 A | * | 10/1995 | Ashby et al. | 372/40 |
| 5,491,707 A | * | 2/1996 | Rieger et al. | 372/25 |
| 5,742,634 A | * | 4/1998 | Rieger et al. | 372/25 |
| 5,774,488 A | | 6/1998 | Kmetec | |
| 5,778,020 A | | 7/1998 | Gokay | |
| 5,848,080 A | * | 12/1998 | Dahm | 372/25 |
| 5,870,421 A | * | 2/1999 | Dahm | 372/75 |
| 5,936,983 A | * | 8/1999 | Yusong et al. | 372/22 |
| 6,061,378 A | * | 5/2000 | Marshall et al. | 372/75 |
| 6,219,361 B1 | * | 4/2001 | Guch et al. | 372/10 |
| 6,229,829 B1 | * | 5/2001 | Yin | 372/22 |
| 6,377,593 B1 | * | 4/2002 | Peterson et al. | 372/11 |
| 6,676,402 B1 | * | 1/2004 | Early et al. | 431/1 |
| 6,822,985 B1 | * | 11/2004 | Tsunekane et al. | 372/29.021 |
| 6,873,639 B1 | * | 3/2005 | Zhang | 372/69 |
| 2002/0105997 A1 | * | 8/2002 | Zhang | 372/70 |

* cited by examiner

*Primary Examiner*—Min Sun Harvey
*Assistant Examiner*—Delma R. Flores-Ruiz
(74) *Attorney, Agent, or Firm*—James A. Quinton

(57) ABSTRACT

A high pulse energy, side pumped laser is provided. The laser has an optical cavity formed between a first and a second reflective surface. A lasing medium is located within the cavity along its optical axis. A plurality of diode bars are provided in optical communication with the lasing medium preferably a lasing rod. The diode bars supply electromagnetic radiation to the lasing rod. The diode bars are configured about the lasing rod so that electromagnetic radiation from the diodes bars propagates through the lasing rod on a plurality of substantially nonintersecting paths. Since the lasing rod is side pumped, the substantially nonintersecting paths traverse the lasing rod substantially perpendicular to the direction of propagation of energy in the laser cavity.

27 Claims, 9 Drawing Sheets

HIGH POWER DIODE SIDE PUMPED SOLID STATE LASER

FIELD OF THE INVENTION

The present invention relates to diode side pumped high pulse energy lasers.

BACKGROUND OF THE INVENTION

Diode side pumped lasers are well known in the art, see U.S. Pat. Nos. 5,778,020 and 5,774,488. For producing high power output from side-pumped solid state lasers, a number of diode bars have been tightly packed together to pump Nd:YAG lasing rod from symmetrically oriented multi-angles to produce high average power. When the laser crystal is not as durable as Nd:YAG, such as Nd:YLF, high pumping intensity along with high laser peak intensity and high average power often results in damage of the laser crystals. For example, current limitation for diode side pumped Q-switched pulsed Nd:YLF laser producing second harmonic wavelength beam is about 20 mJ/pulse at 1 kHz repetition rate. A higher pulse energy from Nd:YLF laser at fundamental or second harmonic wavelength at kHz repetition rates is desirable in many applications such as pumping short pulse amplifiers, dye lasers, high speed particle image velocimetry, laser welding and the like.

SUMMARY OF THE INVENTION

According to the invention, a high pulse energy, diode side pumped laser is provided. The laser has an optical cavity formed between a first and a second reflective surface. A lasing medium is located within the cavity along its optical axis. The lasing medium can be selected from a variety of lasing medium for example Nd:YAG, Nd:YLF or Nd:YVO$_4$ desirably a single lasing rod preferably a Nd:YLF lasing crystal desirably a Nd:YLF lasing rod. A plurality of diode bars are provided in optical communication with the lasing medium preferably a lasing rod. The diode bars supply electromagnetic radiation to the lasing rod. The diode bars are configured about the lasing rod so that electromagnetic radiation from the diode bars propagates through the lasing rod on a plurality of substantially nonintersecting paths. Since the lasing rod is side pumped, the substantially nonintersecting paths traverse the lasing rod substantially perpendicular to the direction of propagation of energy in the laser cavity.

Desirably the diode bars are located along the length of the lasing rod for delivering electromagnetic radiation to the lasing rod on a plurality of substantially nonintersecting paths. As a result, there is no substantial overlap of incoming energy from different diode bars at any point along the lasing rod.

In another aspect of the invention, a high pulse energy intracavity harmonic laser is provided. One or more harmonic crystals are desirably located within the laser cavity to generate a high pulse energy harmonic beam.

In still another aspect to the invention, a high pulse energy laser is provided having a lasing rod desirably a crystal rod having its optical axis through the length of the rod. Six (6) or more diode bars are located along the lasing rod to deliver energy to the rod on substantially nonintersecting paths. Desirably the diodes are located around the periphery of the rod, and are preferably located symmetrically around the rod so the energy incidents on the rod from different sides.

It is an object of the invention to provide a high pulse energy laser which can be pumped at high power without damaging the lasing crystal.

It is an object of the invention to provide a high pulse energy harmonic laser having operational longevity.

It is an object of the invention to provide a high pulse energy Nd:YLF harmonic laser having operational longevity.

The preferred embodiment of the present invention is illustrated in the drawings and examples. However, it should be expressly, understood that the present invention should not be limited solely to the illustrative embodiment.

DETAILED DESCRIPTION OF THE INVENTION

Figure 1:
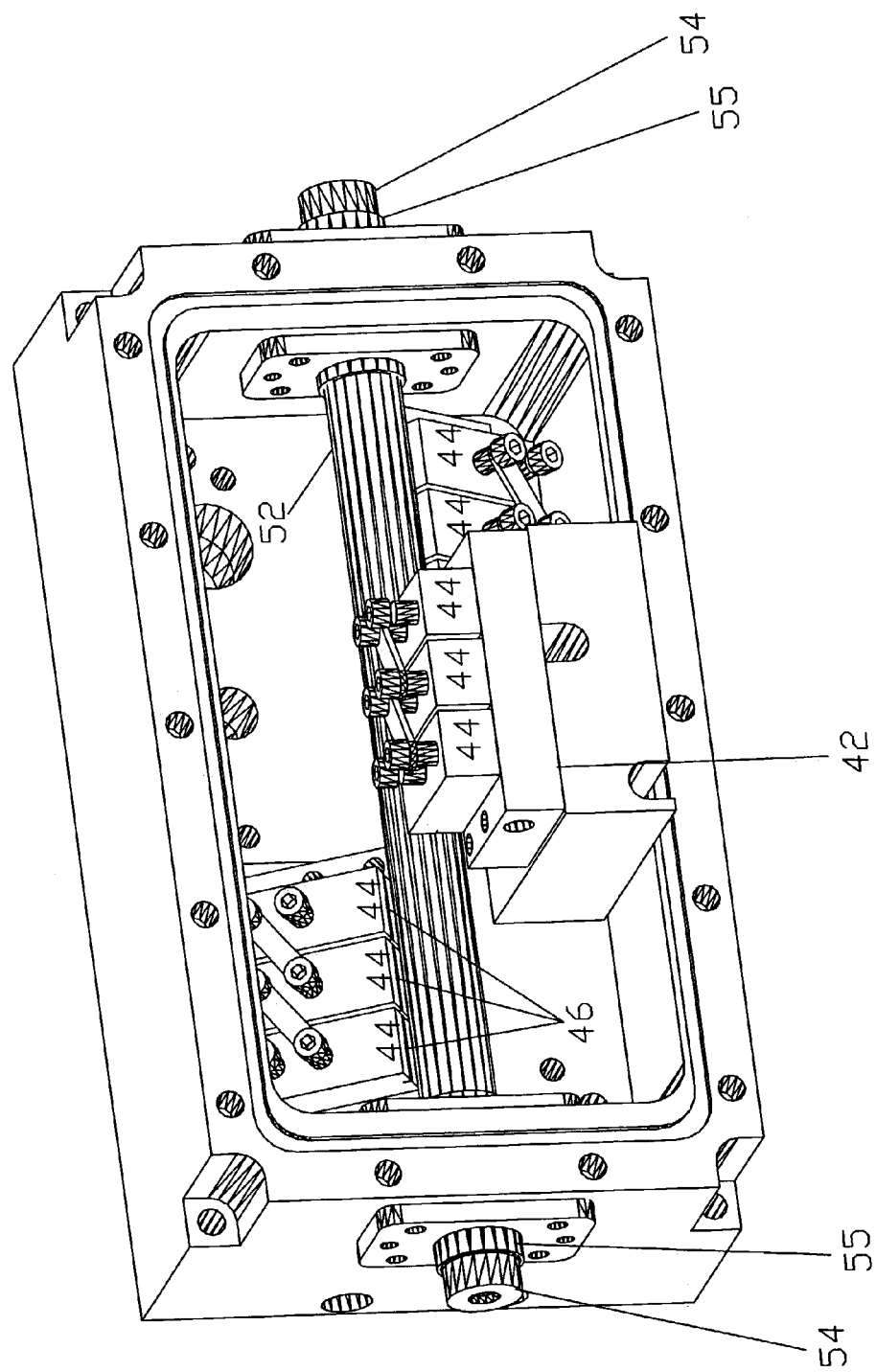
FIG. 1 is a partial perspective view of the laser according to the invention.
Figure 2:
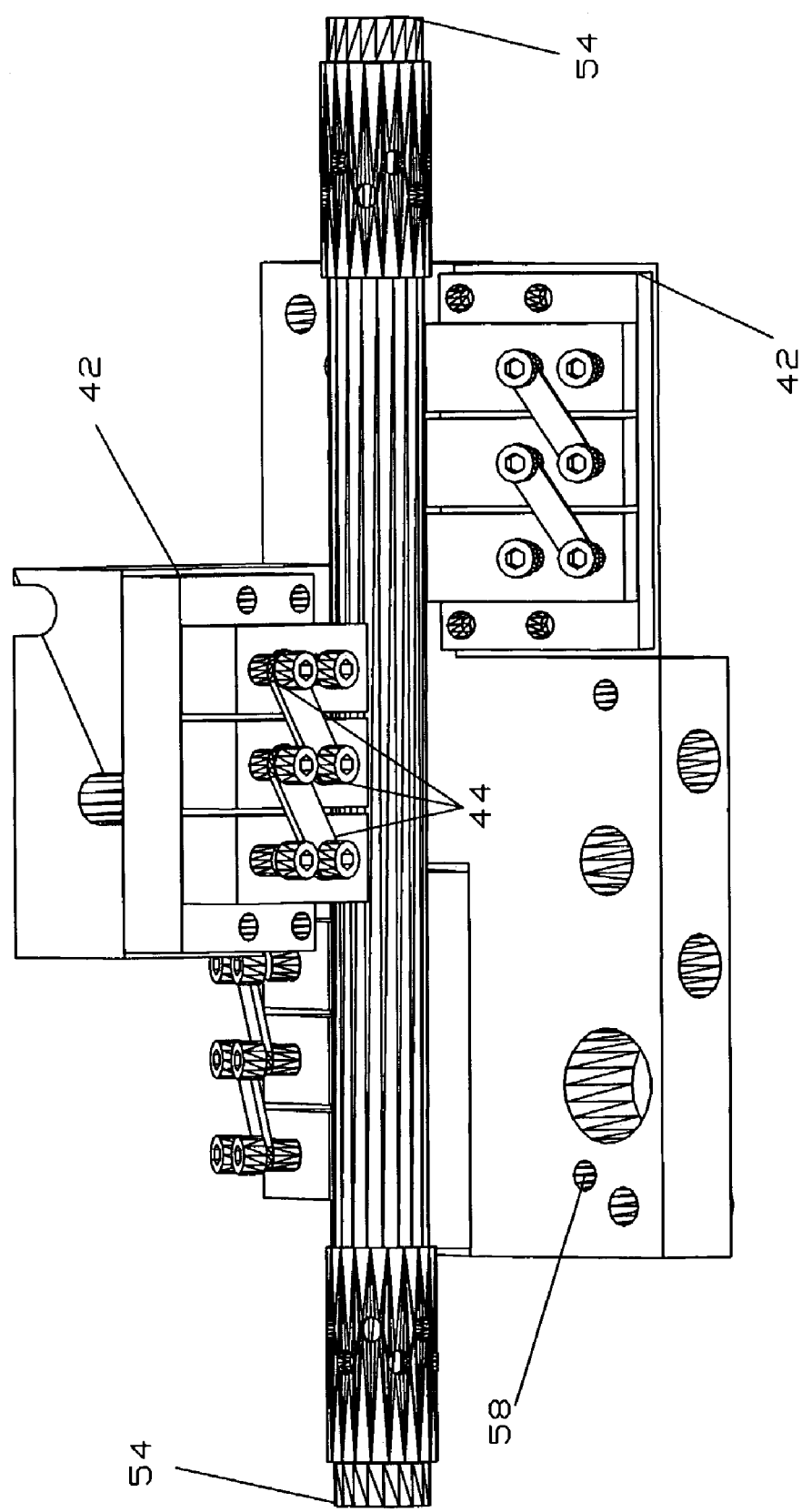
FIG. 2 is a partial perspective view of the laser of FIG. 1 showing the water cooling block.
Figure 3:
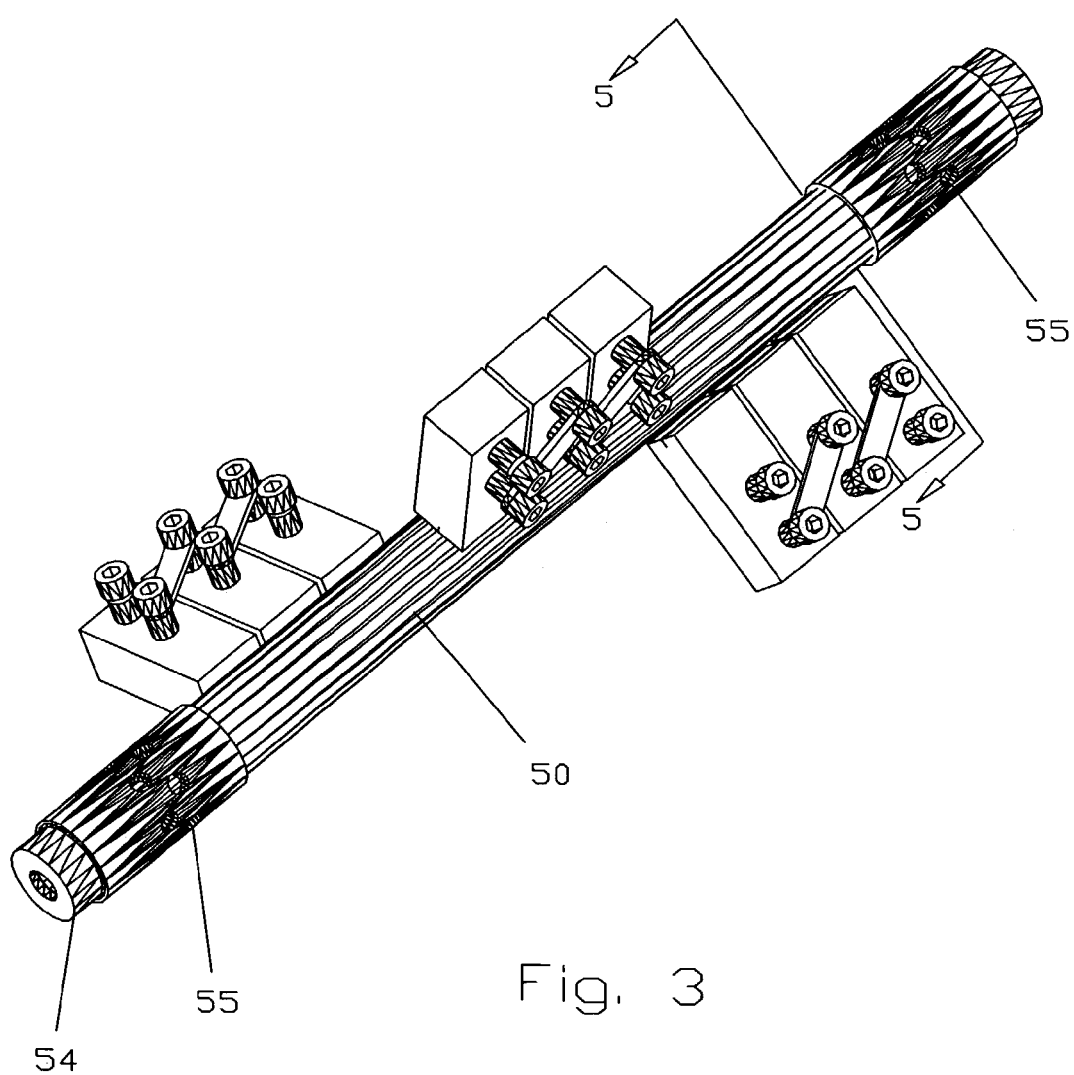
FIG. 3 is a partial perspective view of FIG. 2 without the cooling block.

According to the invention, a high pulse energy, diode side pumped laser is provided. The laser has an optical cavity formed between a first and a second reflective surface preferably a first and second reflecting mirror. A lasing medium desirably a lasing rod is located within the cavity along its optical axis. The lasing medium is desirably a Nd:YAG, Nd:YLF, Nd:GdVO4 or Nd:YVO$_4$ lasing crystal rod preferably a Nd:YLF rod. The lasing rod can have a variety of cross sections desirably circular, rectangular or square. Typically the lasing rod is a cylindrical rod. Desirably the rod has a relatively long length desirably 70 mm or greater in length preferably 90 mm or greater in length. The lasing medium can be desirably a single lasing rod or optionally two or more lasing rods.

A plurality of diode bars are provided in optical communication with the lasing medium preferably a Nd:YLF lasing rod. The diode bars are oriented about the lasing rod to supply electromagnetic radiation through the lasing rod on a plurality of substantially nonintersecting paths. Since the lasing rod is side pumped, the substantially nonintersecting paths traverse the lasing rod substantially perpendicular to the direction of propagation of energy in the laser cavity. As a result, there is no substantial overlap of incoming energy at any give point along the lasing rod. Desirably any overlap is kept to a minimum desirably 20% or less preferably 10% or less.

When two or more lasing rods are employed, desirably a plurality of diode bars are provided in optical communication with each lasing rod. Electromagnetic radiation from the diode bars propagates through each lasing rod on a plurality of substantially nonintersecting paths. Since each lasing rod is side pumped, the substantially nonintersecting paths traverse each lasing rod substantially perpendicular to the direction of propagation of energy in the laser cavity. As a result, there is no substantial overlap of incoming energy at any point along any lasing rod. For example when there are three lasing rods, multiple diode bars would be in optical communication with each lasing rod.

In another aspect of the invention, a high pulse energy intracavity harmonic laser is provided. One or more harmonic crystals are located within the laser cavity to generate a high pulse energy harmonic beam. Preferably a second harmonic nonlinear crystal is located within the cavity to produce a second harmonic beam. Optionally second and third harmonic crystals or second, third, and fourth harmonic crystals are located within the cavity to produce third or fourth harmonic beams.

In still another aspect to the invention, a high pulse energy laser is provided having one or more lasing rods desirably a single crystal rod having its optical axis through the length of the rod. Six (6) or more diode bars preferably nine (9) or more desirably nine (9) to eighteen (18) diode bars are linearly spaced along each lasing rod preferably a Nd:YLF lasing rod to deliver energy to the rod at linearly spaced points along the laser's optical axis. Desirably the diodes are oriented around the periphery of the rod, desirably symmetrically located around the rod so that the electromagnetic radiation from the diodes bars propagates through the lasing rod on a plurality of substantially nonintersecting paths.

Figure 8:
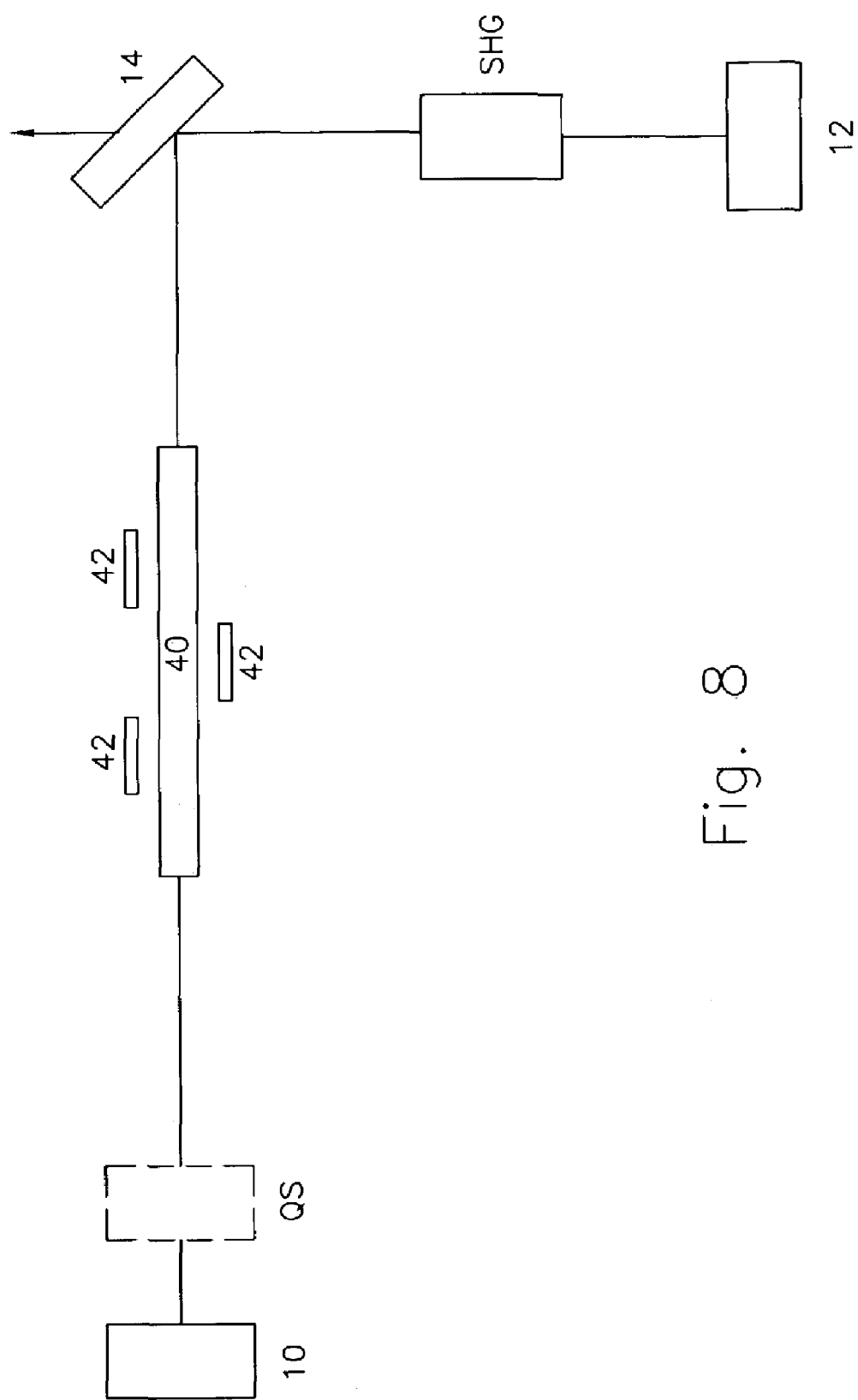
FIG. 8 is a schematic view of a laser according to the invention.
Figure 9:
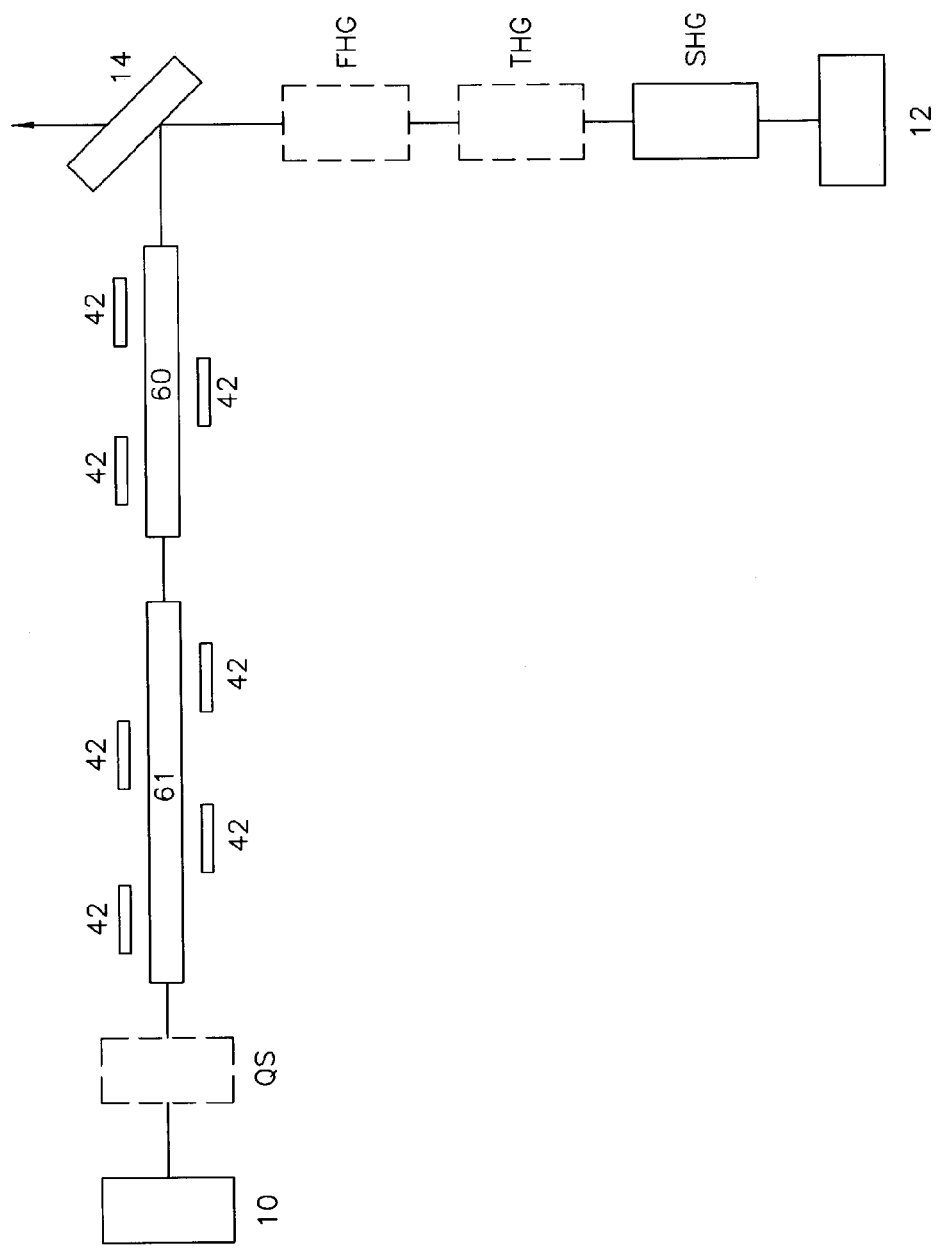
FIG. 9 is a schematic view of an alternative embodiment of laser according to the invention.

Referring to the Figures, a best seen in FIGS. 1, 8 and 9, a laser cavity is formed between mirrors 10 and 12 which are both highly reflective for fundamental beam. One or more lasing rod preferably a single cylindrical Nd:YLF lasing rod 40 is located in the cavity. Desirably the optical axis extends through the entire length of the crystal rod 40. Diode bars 44 preferably banks 42 of diode bars are provided to side pump rod 40.

Figure 4:
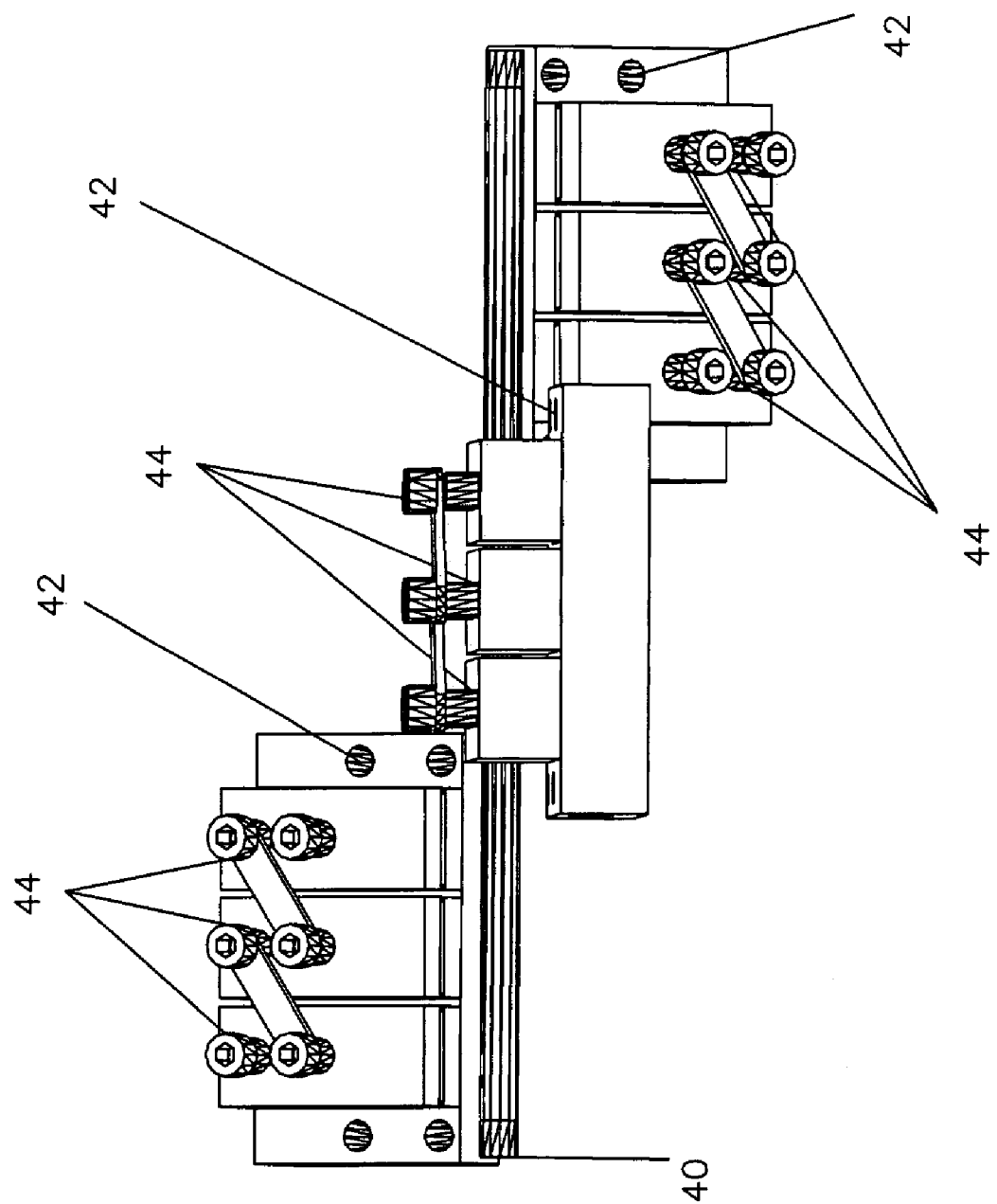
FIG. 4 is a partial perspective view of FIG. 3 without the reflective tube.
Figure 5:
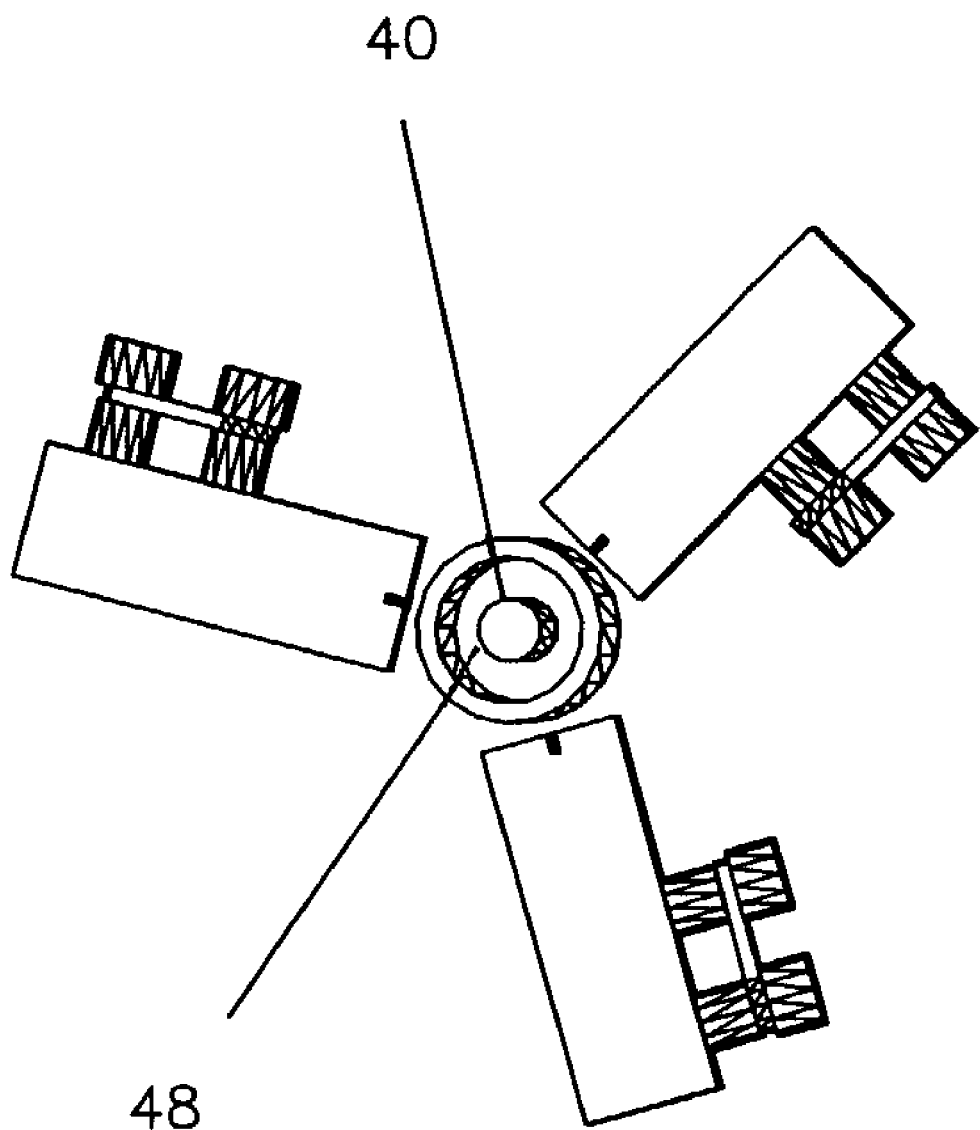
FIG. 5 is a sectional view through 5—5 of FIG. 3.

As best seen in FIGS. 1 to 7, a plurality of diodes bars 44 are provided along the length of the lasing rod 40 for delivering electromagnetic radiation to the lasing rod at a plurality of incident points along the optical axis. Desirably, six (6) or more diode bars preferably nine (9) or more, desirably nine (9) to eighteen (18) diode bars are linearly spaced along a lasing rod 40. Desirably as shown in FIGS. 1 to 4 nine (9) diode bars 44 in three (3) banks 42 are provided. The diode bars 44 are located so that the energy propagating from diode bar outlets 46 propagates through the lasing rod 40 on a plurality of substantially nonintersecting paths as shown in FIGS. 2, 3, 4 and FIG. 6. Preferably the diode bars 44 are provided in banks 42 of 2 or more bars desirably 3 to 6 or more diode bars to a bank preferably 2 to 4 diode bars to a bank. Desirably the diodes bars 44 preferably banks 42 of diode bars are symmetrically located around the lasing rod preferably Nd:YLF rod 40 while preferably being linearly spaced from one another along the optical axis. As a result, there is no substantial overlap of incoming energy along the lasing rod 40. A reflective tube 52 desirably a quartz tube having a reflective coating 50 receive lasing rod 40. The reflective coating 52 is desirably a gold, silver or dielectric reflective coating preferably a gold reflective coating. Slits 56 are provided in coating 50 facing outlets 46 of the banks 42 of diode bars. Desirably the slits 56 are antireflction coated to reduce undesired reflection of the pump beams. As best seen in FIG. 5, a space 48 is preferably provided between reflection tube 52 and lasing rod 40 which acts as a channel for cooling water for the rod 40. Rod holders 54 located at both ends of the lasing rod 40 hold it in place. Tube holders 55 hold reflective tube 52 in position.

Figure 6:
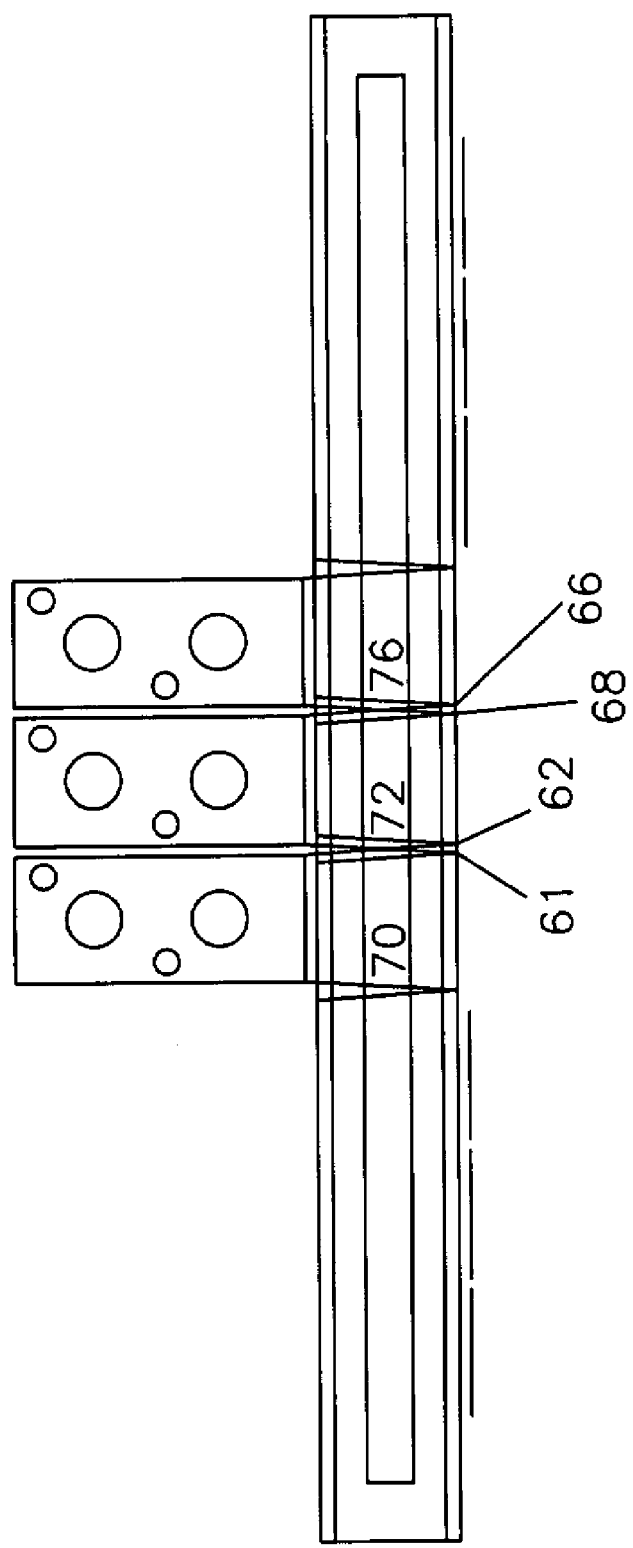
FIG. 6 is schematic top view of the diode reflective tube and crystal.

Preferably the lasing rod 40 is 70 mm or greater desirably 90 mm or greater preferably from 90 to 120 mm in length. Diodes bars are located along the length of the rod, desirably 6 to 18 or more diode bars preferably 9 to 15 diode bars desirably symmetrically located around the rod so that the electromagnetic radiation from the diodes bars propagates through the lasing rod on a plurality of substantially nonintersecting paths. Preferable the diodes bars 44 are linearly spaced apart along the optical axis. As best seen in FIGS. 4 and 6, there can be a small amount of overlap of energy paths of adjacent diode bars. Path 70 has a path side wall 62 that intersects path 72 side wall 64 to provide an insubstantial overlap desirably 20% or less preferably 10% or less.

In another aspect of the invention, as best shown in FIGS. 8 and 9, a high pulse energy intracavity harmonic laser is provided. A Q-switch is provided within the cavity formed between mirrors 10 and 12. A lasing rod 40 is provided in the cavity. Optionally as shown FIG. 9, two (2) or more lasing crystals 60 and 61 can be provided. Desirably as shown in FIG. 8, a folding mirror 14 is provided in optical communication with lasing rod 40. One or more harmonic crystals are located within the laser cavity to generate a high pulse energy harmonic beam. Preferably a second harmonic nonlinear crystal SHG as shown in FIG. 8 is located within the cavity to produce a second harmonic beam. Optionally as shown in FIG. 9 a second harmonic generator SHG and third harmonic generator or second SHG, third THG, and fourth harmonic FHG generators preferably nonlinear crystals are located within the cavity to produce third or fourth harmonic beams. Folding mirror 14 is highly reflective for fundamental beam and highly transmissive for harmonic beam that is for second, third or fourth harmonic depending on the desired harmonic output. Desirably, the diodes and lasing rod are water cooled. Water is provided to base 56 from a convenient source. Conduits are provided in the base 58 to provide water to cool the diode bars 44 and the lasing rod 40. For example each bank of diodes can have a separate stream of cooling water. Within each bank, the diode bars can be serially cooled from a single stream. A separate stream can be, provided to directly cool the crystal by introducing water into the hollow reflecting tube 52 through channel 48.

Figure 7:
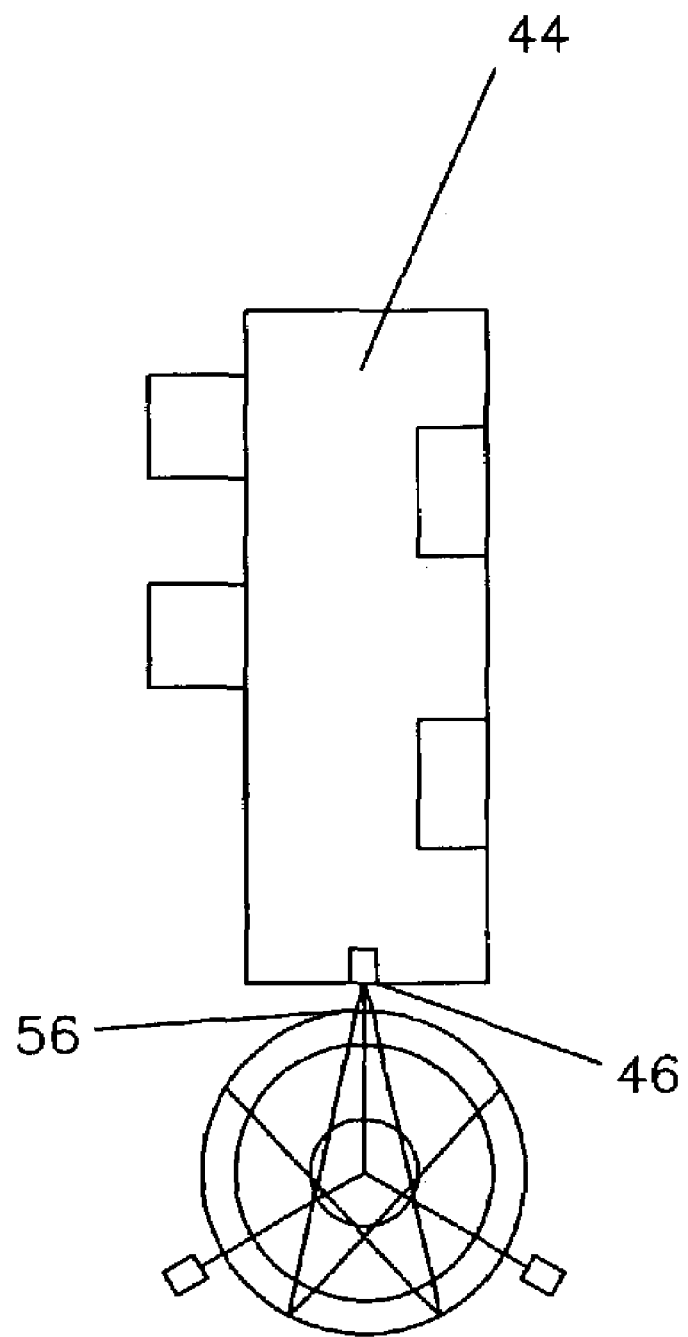
FIG. 7 is a schematic view of the pump beam path.

In operation, the diode bars 44 in diode banks 42 are activated to produce pumping energy for rod 40. The electromagnetic radiation from the diodes bars 44 propagates through the lasing rod on a plurality of substantially nonintersecting paths. Preferable the diodes bars 44 are linearly spaced apart. The energy from the diode bars passes through the anti-reflection coated slits 56 to pump the laser rod. Electromagnetic radiation left from the first pass through the laser rod is reflected back by reflective coating surface 50 of reflecting tube 52 to further pump rod 40. As best seen in FIG. 7, the energy that is not absorbed by rod 40 is reflected by reflective tube 52 back through the rod 40 for further absorption. Since the energy from the diode bars 44 does not substantially overlap, the pump intensity along the laser rod is substantially uniformly distributed. The total amount of available pumping power is distributed along a longer laser rod which results reducing stress placed on the rod 40. As a result, the Nd:YLF rods can be pumped at a greater energy level to produce a higher power output without damaging the crystal.

The foregoing is considered as illustrative only to the principles of the invention. Further, since numerous changes and modification will occur to those skilled in the art, it is not desired to limit the invention to the exact construction and operation shown and described above, and accordingly, all suitable modifications and equivalents may be resorted to, falling within the scope of the invention.

The invention claimed is:

1. A side pumped laser comprising:
   a) a laser cavity formed between a first and a second reflective surface;
   b) said laser cavity having an optical axis;
   c) one or more lasing rod located within said cavity along said optical axis;
   d) a plurality of diode bars having radiation outlets in optical communication with each lasing rod for supplying electromagnetic radiation to said rod;
   e) said electromagnetic radiation propagating through said lasing rod on a plurality of substantially nonintersecting paths; said substantially nonintersecting path having an overlap of 20% or less;
   f) said paths traversing said lasing rod substantially perpendicular to the direction of propagation of energy in the laser cavity.

2. The side pumped laser according to claim 1 wherein said laser is a high energy pulsed laser and said overlap is 10 or less.

3. The side pumped laser according to claim 2 wherein said plurality of diode bars consists of six (6) or more diode bars and said plurality of substantially nonintersecting paths corresponds to the number of diode bars.

4. The side pumped laser according to claim 3 wherein said rod is cylindrical.

5. The side pumped laser according to claim 4 wherein said plurality of diode bars consists of six (6) to eighteen (18) diode bars.

6. The side pumped laser according to claim 4 wherein said plurality of diode bars consists of nine (9) or more diode bars.

7. The side pumped laser according to claim 6 wherein said plurality of diode bars consists of nine (9) to eighteen (18) diode bars.

8. The side pumped laser according to claim 4 wherein said bars are oriented around the periphery of said lasing rod.

9. The side pumped laser according to claim 4 wherein said bars are oriented symmetrically around the periphery of said lasing rod.

10. The side pumped laser according to claim 4 wherein said lasing rod is Nd:YLF.

11. The side pumped laser according to claim 10 wherein lasing rod has a length of 70 mm or greater.

12. The side pumped laser according to claim 10 wherein lasing rod has a length of 90 mm or greater.

13. The side pumped laser according to claim 4 wherein said lasing rod is Nd:YAG.

14. The side pumped laser according to claim 13 wherein lasing rod has a length of 70 mm or greater.

15. The side pumped laser according to claim 14 wherein lasing rod has a length of 90 mm or greater.

16. The side pumped laser according to claim 4 further comprising a harmonic crystal located in said cavity to produce a harmonic beam.

17. The side pumped laser according to claim 16 further comprising a second harmonic crystal located in said cavity to produce a second harmonic beam.

18. The side pumped laser according to claim 16 further comprising a second and third harmonic crystal located in said cavity to produce a third harmonic output beam harmonic beam.

19. The side pumped laser according to claim 16 further comprising a second, third and fourth harmonic crystal located in said cavity to produce a fourth harmonic output beam.

20. The side pumped laser according to claim 4 wherein said bars are located along substantially the entire length of the lasing rod.

21. The side pumped laser according to claim 1 further comprising:
   g) a tube surrounding said lasing rod, said tube having a high reflective coating surrounding said tube;
   h) said high reflective coating having slits to allow said electromagnetic radiation propagating on said plurality nonintersecting paths pass through said coating.

22. A side pumped laser comprising:
   a) a laser cavity formed between a first and a second reflective surface;
   b) said laser cavity having an optical axis;
   c) one or more lasing rod located within said cavity along said optical axis;
   d) a plurality of diode bars having radiation outlets in optical communication with each lasing rod for supplying electromagnetic radiation to said rod;
   e) said electromagnetic radiation propagating through said lasing rod on a plurality of substantially nonintersecting paths; said substantially nonintersecting path having an overlap of 20% or less;
   f) said paths traversing said lasing rod substantially perpendicular to the direction of propagation of energy in the laser cavity;
   g) a hollow tube surrounding said lasing rod for cooling water to flow within said tube to cool said lasing rod;
   h) said hollow tube having a high reflective coating said coating reflecting electromagnetic radiation propagating on said plurality of substantially nonintersecting paths for a further pass through said lasing crystal;
   i) said high reflective coating having slits aligned with said radiation outlets to allow electromagnetic radiation propagating on said plurality nonintersecting paths to pass through said coating.

23. The side pumped laser according to claim 22 wherein said reflective coating is a gold.

24. The side pumped laser according to claim 23 wherein said reflective coating is silver.

25. The side pumped laser according to claim 1 wherein a single lasing rod is located within said cavity.

26. The side pumped laser according to claim 1 wherein two or more lasing rods are located within said cavity.

27. The side pumped laser according to claim 1 wherein two lasing rods are located within said cavity.

* * * * *